(12) United States Patent
Trotta (10) Patent No.: US 9,998,080 B2
(45) Date of Patent: Jun. 12, 2018

(54) LOW VOLTAGE SUPPLY AMPLIFIER

(71) Applicant: Infineon Technologies AG, Neubiberg (DE)

(72) Inventor: Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/335,181

(22) Filed: Oct. 26, 2016

(65) Prior Publication Data
US 2018/0115289 A1    Apr. 26, 2018

(51) Int. Cl.
*H03F 3/45*     (2006.01)
*H03F 3/195*    (2006.01)
*H03F 1/02*     (2006.01)

(52) U.S. Cl.
CPC ....... *H03F 3/45085* (2013.01); *H03F 1/0205* (2013.01); *H03F 3/195* (2013.01); *H03F 2200/12* (2013.01); *H03F 2200/451* (2013.01); *H03F 2203/45031* (2013.01); *H03F 2203/45056* (2013.01); *H03F 2203/45151* (2013.01); *H03F 2203/45172* (2013.01)

(58) Field of Classification Search
CPC ............ H03F 3/45089; H03F 3/45085; H03F 1/0205; H03F 3/195
USPC ................... 330/252, 253, 254, 261
See application file for complete search history.

(56) References Cited

U.S. PATENT DOCUMENTS

| | | | |
|---|---|---|---|
| 7,176,758 B2 | 2/2007 | Rein et al. | |
| 7,218,174 B2 * | 5/2007 | Baskett | H03F 3/45085 330/252 |

* cited by examiner

*Primary Examiner* — Khanh V Nguyen
*Assistant Examiner* — Khiem Nguyen
(74) *Attorney, Agent, or Firm* — Slater Matsil, LLP (57) ABSTRACT

A circuit includes a differential input pair stage including bipolar transistors and configured to receive an RF input signal; a cascode stage coupled between the differential input pair stage and an output node, the cascode stage including bipolar transistors; and a current source including a first bipolar transistor coupled to a first output of the differential input pair stage and a second bipolar transistor coupled to a second output of the differential input pair stage.

25 Claims, 7 Drawing Sheets

LOW VOLTAGE SUPPLY AMPLIFIER

TECHNICAL FIELD

The present invention relates generally to an electronic device, and more particularly to a low voltage supply amplifier.

BACKGROUND

Electronic devices such as cellular phones, tablet computers and wearable devices, generally contain signal processing systems that have interfaces to the analog world. Such interfaces may include amplifiers that receive analog input signals and output amplified signals to later amplification and/or signal processing stages. The use of amplifiers typically allows for improved signal-to-noise ratio (SNR), power supply rejection ratio (PSRR) and other performance metrics of the system.

Amplifiers may be implemented discretely or may be integrated in an integrated circuit. Amplifiers may be implemented with metal-oxide-semiconductor field-effect transistors (MOSFETs), bipolar junction transistors (BJT), or other transistor technologies.

As technology evolves, there has been an increase emphasis in improving power consumption while maintaining or improving other performance metrics. A typical approach for lowering power consumption has been to lower the operating voltage of the system. There are, however, physical limitations imposed by the physical characteristics of a particular device. In such lower voltage systems, allocating adequate headroom for the operation of active devices is a common design challenge.

SUMMARY

A circuit includes a differential input pair stage including bipolar transistors and configured to receive an RF input signal; a cascode stage coupled between the differential input pair stage and an output node, the cascode stage including bipolar transistors; and a current source including a first bipolar transistor coupled to a first output of the differential input pair stage and a second bipolar transistor coupled to a second output of the differential input pair stage.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a radio-frequency (RF) amplifier utilizing bipolar transistor technology and configured to operate with a low voltage supply in various topologies. Embodiments of the present invention may also be applied to amplifiers operating at a different frequency range, with a high voltage supply, with different a different transistor technology or in other topologies.

In an embodiment of the present invention, an RF amplifier having a cascode output stage has a split differential pair. The first differential pair may be configured to receive an RF input signal and may be biased with a bias voltage. The first differential pair, therefore, may function as an amplifier as well as a current source for the cascode stage. The second differential pair may have an output coupled to the output of the first differential pair and may be biased with the same bias voltage as the first differential pair. The second differential pair, therefore, may function as a current source for the cascode stage. Since the second differential pair may not be affected by the RF input signal, the second differential pair may not be affected by self-biasing. The cascode stage, therefore, is biased by the summation of bias currents provided by the first differential pair and the second differential pair, thereby receiving a bias current that is less susceptible to variations based on the RF input signal.

A current mirror may be used to bias an RF circuit using bipolar transistors. The current mirror may behave as a current source, receiving an input current and outputting a scaled copy of the input current. The current mirror typically receives a stable reference current, which may be provided by a stable reference such as a bandgap reference. When current mirrors are used to bias a bipolar circuit, the current mirror may be stacked with other amplifier stages. An implication of such technique is that the current mirror may consume some of the voltage headroom available in the system, leaving a lower voltage headroom for the stacked amplifier. Using traditional current mirrors, therefore, may impose a limit on how low the supply voltage may be for proper operation of a stacked amplifier, such as, for example, a cascode amplifier. For example, a current mirror may take 1 V of headroom to operate appropriately. Given that a typical base-emitter voltage $V_{be}$ may be 0.8 V, it may not be possible to operate a cascode amplifier with a stacked current mirror with a 1.8 V supply.

Alternative biasing techniques with lower headroom requirements have been used in the past. For example, biasing of bipolar transistors may be achieved by using a resistor to set the operating point of the transistors. The voltage consumed by such biasing technique may be limited by the voltage drop across the resistor, which may be, for example, 200 mV. An implication of employing biasing by using a resistor may be self-biasing. In other words, the bias current may be based, in part, on the input signal. A varying input signal, therefore, may cause the bias current to change. Changing the bias current may affect the collector-base voltage $V_{cb}$ of the bipolar transistors being biased. A sufficiently large change in the bias current, therefore, may cause a bipolar transistor to change, for example, from the linear mode to the saturation mode.

Figure 1A:
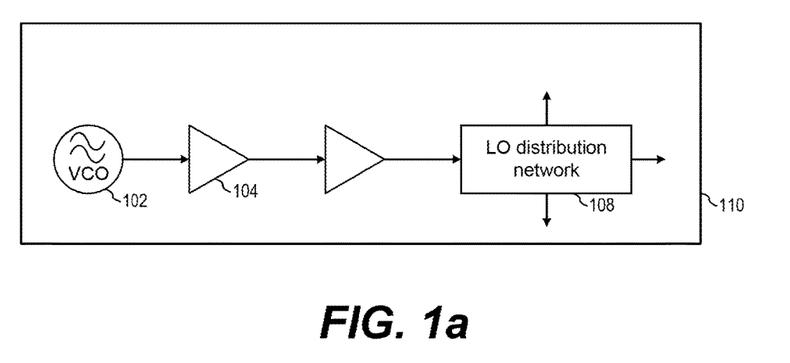
FIG. 1a shows an exemplary frequency modulated continuous wave (FMCW) system, according to an embodiment of the present invention.

Amplifiers may be configured as buffers and may amplify signals in a signal chain. For example, FIG. 1a shows an exemplary frequency modulated continuous wave (FMCW) system, according to an embodiment of the present invention. The FMCW system may include integrated circuit (IC) 110 including voltage-controlled oscillator (VCO) 102, buffer 104 and LO distribution network 108. As can be seen from FIG. 1a, buffer 104 may be used to buffer the RF signal at the output of VCO 102 before such signals are received by LO distribution network 108.

Figure 1B:
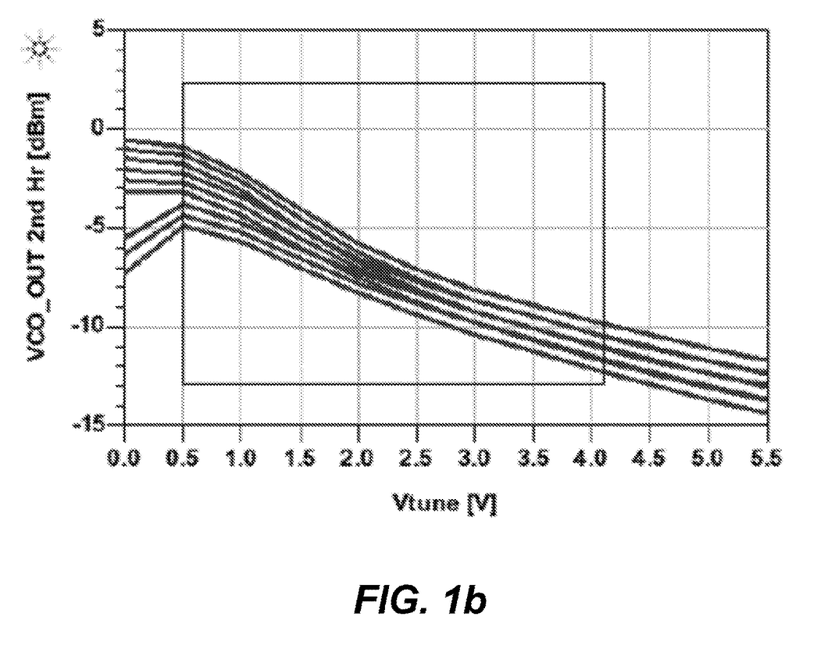
FIG. 1b shows a typical output profile of VCO 102.

Some circuits may exhibit different output amplitudes under different operating conditions. For example, the signal level coming out of VCO 102 during chirps may not be constant over the VCO's operating bandwidth. FIG. 1b shows a typical output profile of VCO 102, according to an embodiment of the present invention. Specifically, FIG. 1b shows how the output voltage of VCO 102 varies versus the input voltage of VCO 102. Since the output frequency of VCO 102 versus input voltages of VCO 102 controls the output frequency, FIG. 1b can also be understood as how the output voltage swing of VCO 102 varies with respect to the output frequency of VCO 102.

In some embodiments of the present invention, an RF amplifier having a cascode stage including a common-base amplifier is biased with a split differential pair. A first differential pair is configured to receive an RF input signal and amplify such signal in the output of the first differential pair. The first differential pair is biased with a bias voltage such that the first differential pair also operates as a current source for the common-base amplifier. A second differential pair may be biased with the same bias voltage as the first differential pair, and may be configured as a current source for the common-base stage. Since the second differential pair may not suffer from self-biasing, the extra bias current provided by the second differential pair may be used by the common-base stage in order to provide sufficient output power to a load without reaching saturation.

Figure 2A:
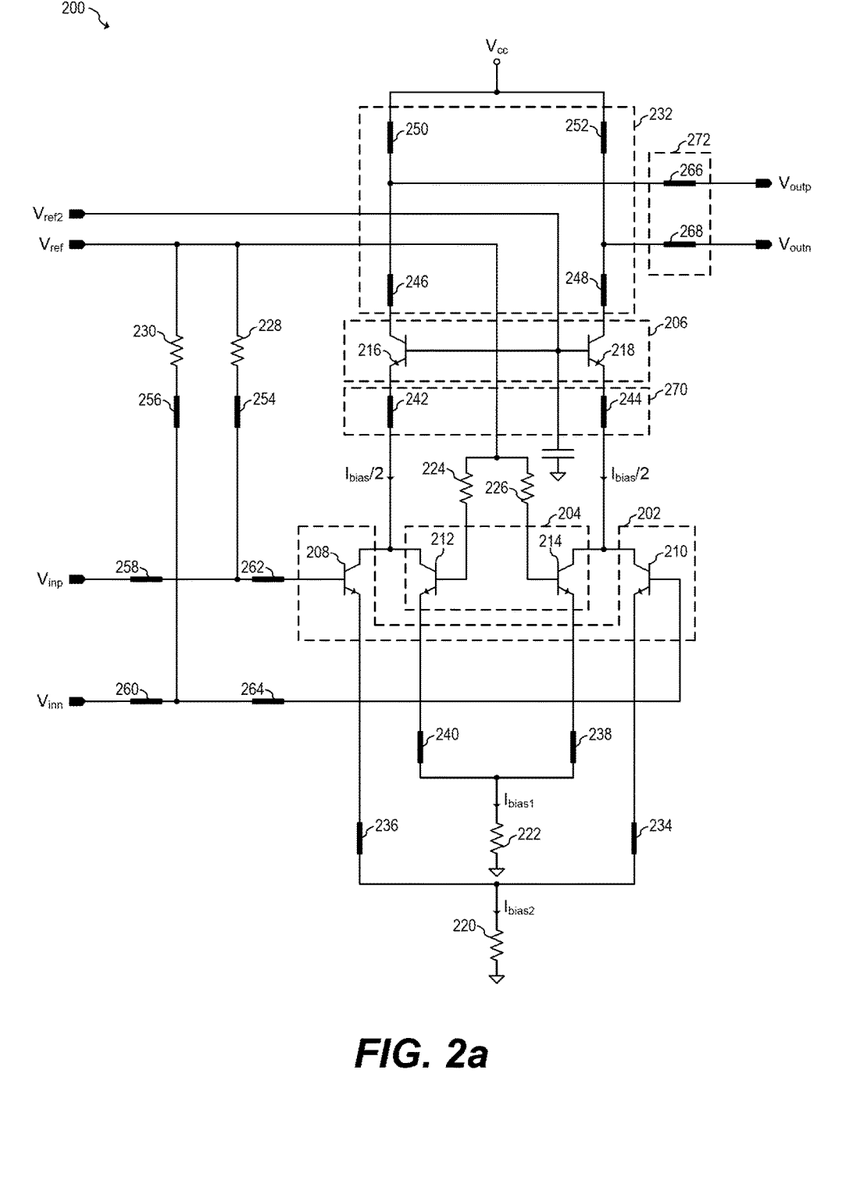
FIG. 2a shows an RF amplifier according to an embodiment of the present invention.

FIG. 2a shows RF amplifier 200 according to an embodiment of the present invention. RF amplifier 200 includes differential input pair 202, current source 204, and common-base stage 206. RF amplifier 200 further includes differential input terminals $V_{inp}$ and $V_{inn}$, differential output terminals $V_{outp}$ and $V_{outn}$, supply terminal $V_{cc}$, inductive voltage divider 232, resistors 220, 222, 224, 226, 228 and 230, and references voltages $V_{ref}$ and $V_{ref2}$.

During normal operation, differential input terminals $V_{inp}$ and $V_{inn}$, receive an RF input signal, which may be amplified and buffered into output terminals $V_{outp}$ and $V_{outn}$. The RF input signal may operate at a frequency of, for example, greater than 10 GHz, and may be 60 GHz. Alternatively, other frequencies outside of this range may be use. Specifically, differential input pair 202 may amplify the RF input signal and generate an RF signal that is input to common-base stage 206. Common-base stage 206 receives the RF signal from differential input pair 202 and generates an RF output signal in output terminals $V_{outp}$ and $V_{outn}$. Differential input pair 202 may provide bias current to common-base stage 206. The average or DC component of the bias current provided by differential input pair 202 to common-base stage 206 is based on bias voltage $V_{ref}$ as well as being proportional to the input received by input signal received by differential input pair 202 due to self-biasing. Additional bias current for common-base stage 206 may be provided by current source 204. In various embodiment, combining the bias currents provided by differential input pair 202 and current source 204 may prevent or reduce saturation of common-base stage 206. Such additional bias current may also prevent saturation of differential input pair 202.

Differential input pair 202 includes transistors 208 and 210 and may be configured as an emitter-coupled pair. The emitter of transistors 208 and 210 may be coupled together through transmission line elements 234 and 236, which may improve stability of the circuit.

Resistor 220 may have a resistance of between about 5Ω and about 30Ω, for example 15Ω. Other resistance values may be used. As shown resistor 220 is coupled to the emitters of transistors 208 and 210. Reference voltage $V_{ref}$ is applied to the bases of transistors 208 and 210 such that bias current $I_{bias2}$ is produced. In the absence of an RF input signal, bias current $I_{bias2}$ may be constant, and the voltage drop produced across resistor 220 may be, for example, less than 200 mV. In the presence of an RF input signal, however, bias current $I_{bias2}$ may vary due to self-biasing. Bias current $I_{bias2}$ may be on average, for example, 2.5 mA.

Current source 204 includes transistors 212 and 214 and is configured as an emitter-coupled pair. In some embodiments, the emitters of transistors 212 and 214 are coupled together through transmission line elements 240 and 238 to improve the stability of the circuit. However, in an alternative embodiment, instead of circuit 204 being configured as a emitter coupled pair, a separate resistor to ground could be used for each of transistor 212 and 214.

Resistor 222 may be have a resistance of between about 50Ω, and about 100Ω, and may be, for example, a 75Ω, resistor. Other resistance values may be used. Resistor 222 may be coupled to the emitter of transistors 212 and 214. Reference voltage $V_{ref}$ provides a bias voltage to the base of transistors 212 and 214 such that bias current $I_{bias1}$ is produced. Since the bases of transistors 212 and 214 of current source 204 are coupled to a DC voltage $V_{ref}$, bias current $I_{bias1}$ may be constant. Since reference voltage $V_{ref}$ behaves as an RF ground and since resistors 230 and 238 are between $V_{ref}$ and differential input terminals $V_{inp}$ and $V_{inn}$, the input RF signal is essentially decoupled from current source 204. Thus, current source 204 provides a scaled version of bias current $I_{bias2}$ without the self-biasing component. The voltage drop produced across resistor 222 may be, for example, less than 200 mV. Bias current $I_{bias1}$ may be on average, for example, 0.5 mA.

Combining bias currents $I_{bias1}$ and $I_{bias2}$ into bias current $I_{bias}$ may be sufficient to prevent saturation of common-base stage 206 even in the presence of an RF input signal. That is, even if bias current $I_{bias2}$ exhibits a large fluctuation because of self-biasing, bias current $I_{bias}$ may not fluctuate to the same degree, in part, because of the presence of bias current $I_{bias1}$, which may not be susceptible to self-biasing. The impact of self-biasing that may be present in bias current $I_{bias}$, therefore, may be proportionally smaller than that observed if bias current $I_{bias1}$ were not used. The extra bias current provided by current source 204 may suffice to maintain the collector-base voltage $V_{cb}$ of each transistor above −0.3 V, thereby keeping them outside of the saturation mode.

Reference voltages $V_{ref}$ and $V_{ref2}$ may be generated internally in any way known in the art. For example, voltages $V_{ref}$ and $V_{ref2}$ may be provided by a stable voltage reference, such as a bandgap reference. Alternatively, voltages $V_{ref}$ and $V_{ref2}$ may be provided by a circuit relying on a bandgap reference. In some embodiments, voltages $V_{ref}$ and $V_{ref2}$ may be provided externally.

Transistors 208, 210, 212, 214, 216 and 218 may be implemented using npn SiGe bipolar transistors. Alternatively, other transistor types such as NMOS and GaN transistors may be used. In some embodiments, transistors 208, 210, 212, 214, 216 and 218 may be implemented using pnp transistors. The selection of which transistor to use may be made according to the specifications and voltage levels of the particular system being designed and appropriate adjustments to the circuit may be made to accommodate the particular device type.

Transmission line elements 234, 236, 238, 240, 242, 244, 246, 248, 250, 252, 254, 256, 258, 260, 262, 264, 266, and 268, may behave as inductive elements, and be used for stability purposes, impedance matching, or any other purpose known in the art. For example, transmission line elements 234, 236, 238, and 240 may be used for improving the stability of the system. Matching structure 272 may be formed by transmission line elements 266 and 268 and may be used for impedance matching with a load coupled to output terminals $V_{outp}$ and $V_{outn}$. Transmission line elements 242 and 244 may form matching structure 270, which may be used for impedance matching between the output of differential input pair 202 and common-base stage 206. Inductive voltage divider 232 may be formed by transmission line elements 246, 248, 250, and 252 and may be used to scale the output voltage as well as a matching load to the system.

Advantages of various embodiments include the possible operation of a cascode amplifier utilizing bipolar transistors with a supply voltage lower than three times the base-emitter voltage $V_{be}$ of the bipolar transistors. For example, as can be seen from FIG. 2a, there are only two stacked transistors between supply terminal $V_{cc}$ and ground. If 0.8 V of headroom is allocated for each transistor, and the drop across resistors 220 and 222 is less than 200 mV, operating RF amplifier 200 with a supply of 1.8 V may be possible.

Figure 2B:
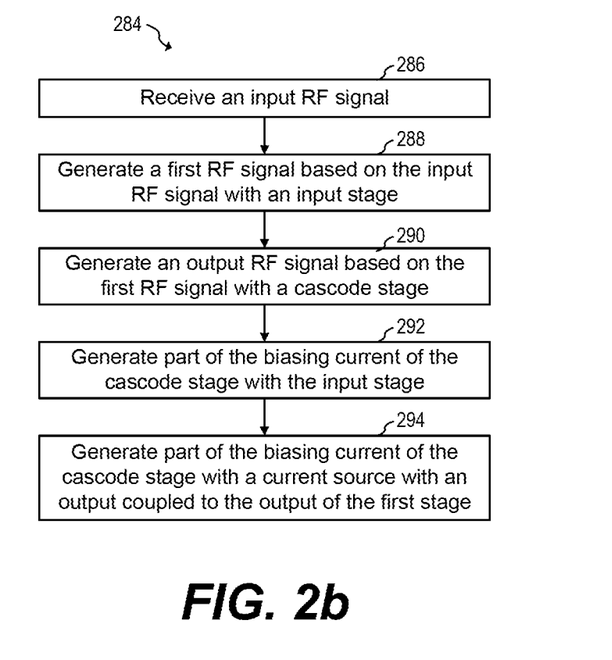
FIG. 2b illustrate a flow chart of an embodiment method of operating an RF amplifier, according to an embodiment of the present invention.

FIG. 2b illustrates a flow chart of embodiment method 284 of operating an RF amplifier, according to an embodiment of the present invention. Method 284 may be used to generate bias currents for different stages of the RF amplifier while amplifying the RF signal. The bias current generation may be split into at least two circuits. A portion of the bias current may be generated with a first circuit and another portion of the bias current may be generated with a second circuit. The second circuit may not be susceptible to self-biasing. Method 284 may be implemented with RF amplifier 200. Alternatively, method 284 may be implemented with other circuit architectures and in other ways known in the art. The discussion that follows assumes that RF amplifier 200, as shown in FIG. 2a, implements method 284 of operating an RF amplifier.

Step 286 receives an RF input signal by using, for example, differential input pair 202. Step 288 generates a first RF signal based on the RF input signal with an input stage, such as differential input pair 202. Step 290 generates an RF output signal based on the first RF signal with a cascode stage, such as common-base stage 206. Step 292 generates part of the bias current used by the cascode stage by using the input stage. Since the input stage is also receiving the RF input signal, the input stage may exhibit self-biasing. Step 294 generates another part of the bias current used by the cascode stage by using a current source having an output coupled to the output of the first stage, such as current source 204. Since the current source may not be configured to receive an RF signal, the current source may not exhibit self-biasing, thus reducing the percentage variation of the bias current received by the cascode stage.

Figure 2C:
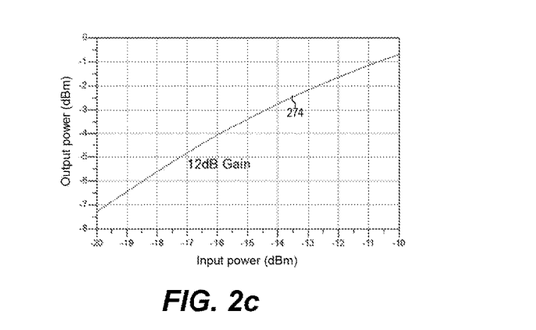
FIGS. 2c, 2d and 2e show simulation results of an RF amplifier, according to an embodiment of the present invention.
Figure 2D:
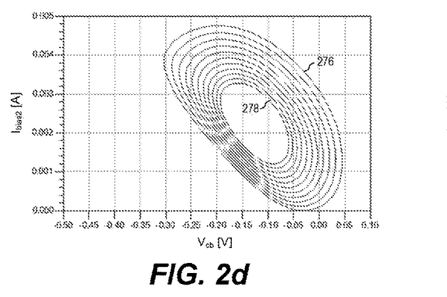
Figure 2E:
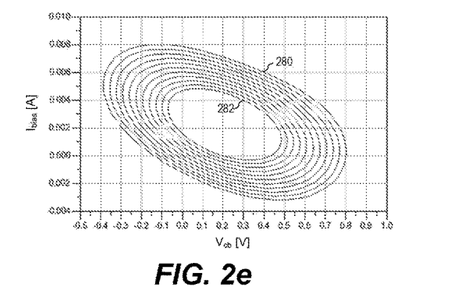

FIGS. 2c, 2d and 2e show simulation results of RF amplifier 200, according to an embodiment of the present invention. FIG. 2c shows a plot of the output power versus the input power of RF amplifier 200 for 12 dB of gain. Specifically, curve 274 shows the relationship between input power and output power in dBm. For example, as shown in FIG. 2c and curve 274, an input power of −16 dBm corresponds to an output power of −4 dBm.

FIG. 2d shows a load line plot for bipolar transistors inside common-emitter stage. Specifically, FIG. 2d shows 11 concentric curves, such as curve 276 and curve 278, depicting the relationship between the collector-base voltage $V_{cb}$ and bias current $I_{bias2}$ for different input power levels increasing in steps of 1 dBm. Curve 278 corresponds to an input power level of −20 dBm and curve 276 corresponds to an input power level of −10 dBm. As shown in FIG. 2d, the greater the input power level, the higher the bias current $I_{bias2}$ achieved, suggesting that the circuit is exhibiting a degree of self-biasing. Bias current $I_{bias2}$, however, is kept above a collector-base voltage $V_{cb}$ of −0.3 V for at least 10 of the 11 input power levels, thereby preventing transistors 276 and 278 from reaching saturation.

FIG. 2e shows a load line plot for bipolar transistors inside common-base stage.

Specifically, FIG. 2e shows 11 concentric curves, such as curve 280 and curve 282, depicting the relationship between the collector-base voltage $V_{cb}$ and bias current $I_{bias}$ for different input power levels increasing in steps of 1 dBm. Curve 282 corresponds to an input power level of −20 dBm and curve 280 corresponds to an input power level of −10 dBm. As shown in FIG. 2e, the greater the input power level, the higher the bias current $I_{bias}$ achieved, suggesting that the circuit is exhibiting a degree of self-biasing. Bias current $I_{bias}$, however, is kept above a collector-base voltage $V_{cb}$ of −0.3 V for at least 8 of the 11 input power levels, thereby preventing transistors 280 and 282 from reaching saturation.

Figure 3:
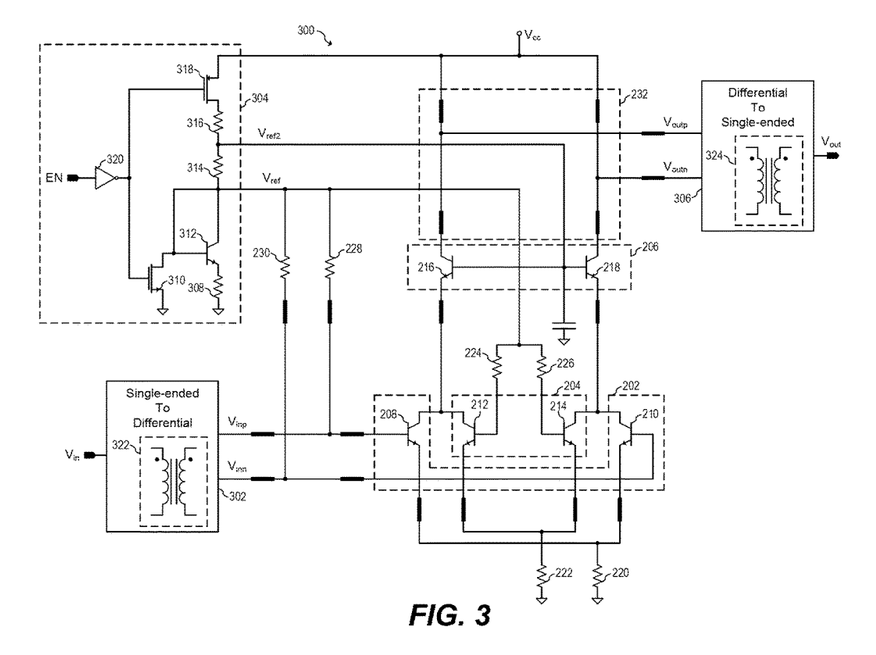
FIG. 3 shows an RF amplifier illustrating particular implementations of various blocks, according to an embodiment of the present invention.

FIG. 3 shows RF amplifier 300 illustrating particular implementations of various blocks, according to an embodiment of the present invention. RF amplifier 300 includes differential input pair 202, current source 204, and common-base stage 206. RF amplifier 300 further includes single-ended input terminal $V_{in}$, single-ended output terminal $V_{out}$, supply terminal $V_{cc}$, inductive voltage divider 232, resistors 220, 222, 224, 226, 228 and 230, and references voltages generator 304.

RF amplifier 300 may operate in a similar manner than RF amplifier 200 and may implement method 284 of operating an RF amplifier. RF amplifier 300, however, has a single-ended input and a single-ended output. RF amplifier 300 also includes reference voltages generator 304.

As shown in FIG. 3, RF amplifier 200 may be modified to include single-ended input $V_{in}$ and single-ended output $V_{out}$ by using balun circuits 302 and 306. As shown, single-ended-to-differential circuit 302 is coupled between single-ended input Vin and input terminals $V_{inp}$ and $V_{inn}$, and differential-to-single-ended circuit 306 is coupled between differential output terminals $V_{outp}$ and $V_{outn}$ and single-ended output $V_{out}$. Single-ended-to-differential circuit 302 and differential-to-single-ended circuit 306 may be implemented in any way known in the art and may each include a transformer, such as transformer 322 and 324 respectively.

Reference generator 304 generates reference voltage $V_{ref}$ and $V_{ref2}$. During normal operation, transistor 310 is turned off and transistor 318 is enabled to pull up reference voltages $V_{ref}$ and $V_{ref2}$. A current, therefore, may flow through diode-connected transistor 312 and resistor 308. Since differential input pair 202 is coupled to resistor 220, the bias current flowing through differential input pair 202 and resistor 220 tracks the current flowing through diode-connected transistor 312 and resistor 308. Reference voltages $V_{ref}$ and $V_{ref2}$ may be set to, for example, 1 V and 1.5 V respectively. During the off-mode, transistor 318 is disabled and transistor 310 is enabled. Transistor 310, therefore, pulls-down $V_{ref}$ and $V_{ref2}$ to ground, thereby turning off transistors 208, 210, 212, 214, 216 and 218. By turning off transistors 208, 210, 212, 214, 216 and 218, power may be saved. Enable input EN may be used to control whether reference voltage generator 304 is on or off. Reference voltage generated 304 may be implemented in other ways known in the art.

Figure 4:
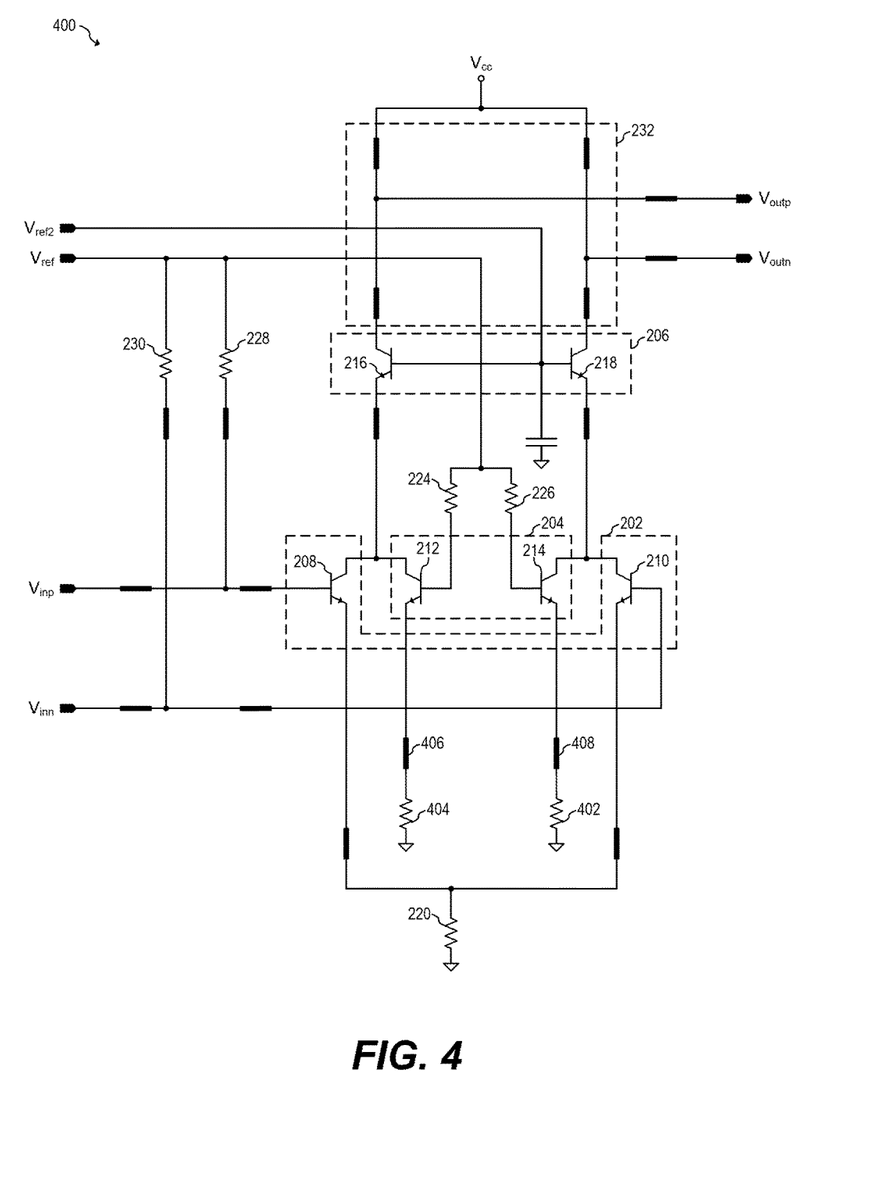
FIG. 4 shows another RF amplifier, according to an embodiment of the present invention.

FIG. 4 shows RF amplifier 400, according to an embodiment of the present invention. RF amplifier 400 includes differential input pair 202, current source 204, and common-base stage 206. RF amplifier 400 further includes differential input terminals $V_{inp}$ and $V_{inn}$, differential output terminals $V_{outp}$ and $V_{outn}$, supply terminal $V_{cc}$, inductive voltage divider 232, resistors 220, 402, 404, 224, 226, 228 and 230, and reference voltages $V_{ref}$ and $V_{ref2}$.

RF amplifier 400 may operate in a similar manner as RF amplifier 200 and may implement method 284 of operating an RF amplifier. RF amplifier 400, however, has the emitter terminals of transistors 212 and 214 of current source 206 coupled to ground through separate circuit paths. Specifically, the emitter of transistor 212 may be coupled to ground through transmission line element 406 and resistor 404. Similarly, the emitter of transistor 214 may be coupled to ground through transmission line element 408 and resistor 402.

One general aspect includes a circuit including: a differential input pair stage including bipolar transistors and configured to receive an RF input signal; a cascode stage coupled between the differential input pair stage and an output node, the cascode stage including bipolar transistors; and a current source including a first bipolar transistor coupled to a first output of the differential input pair stage and a second bipolar transistor coupled to a second output of the differential input pair stage.

Implementations may include one or more of the following features. The circuit where the differential input pair stage is coupled to a first reference voltage node and is further coupled to a first resistor coupled to a ground terminal, and the current source is coupled to the first reference voltage node and is further coupled to a second resistor coupled to the ground terminal. The circuit further including a reference voltage generator coupled to the first reference voltage node. The circuit where the cascode stage is further coupled to a second reference voltage node. The circuit where the reference voltage generator is further coupled to the second reference voltage node. The circuit where the first bipolar transistor of the current source and the second bipolar transistor of the current source form a differential pair. The circuit where emitters of the differential pair of the current source are coupled to each other through a transmission line element. The circuit where the first bipolar transistor of the current source includes an emitter coupled to ground through a first transmission line element coupled in series with the second resistor, and the second bipolar transistor of the current source includes an emitter coupled to ground through a second transmission line element coupled in series with a third resistor. The circuit where the first resistor has a resistance between 5Ω, and 30Ω, and the second resistor has a resistance between 50Ω, and 100Ω. The circuit where emitters of the differential input pair stage are coupled to each other through a transmission line element. The circuit where the RF input signal has a frequency between 10 GHz and 100 GHz. The circuit where a supply terminal coupled to the cascode stage is configured to receive a supply voltage lower than three times a forward biased base-emitter voltage of the bipolar transistors of the differential input pair stage. The circuit where the supply voltage includes a voltage lower than 2 v. The circuit further including: a first balun circuit coupled to an output of the cascode stage, the first balun circuit having a first transformer; and a second balun circuit coupled to an input of the differential input pair stage, the second balun circuit having a second transformer. The circuit where an inductive voltage divider is coupled to an output of the cascode stage.

Another general aspect includes a method of operating an RF amplifier including a differential input pair stage including bipolar transistors, the differential input pair stage coupled to a first resistor coupled to ground, a cascode stage including bipolar transistors and having an input coupled to an output of the differential input pair stage, and a current source including bipolar transistors having an output coupled to the output of the differential input pair stage, the current source coupled to a second resistor coupled to ground, the method including: receiving an RF input signal with the differential input pair stage; generating a first bias current with the current source; generating a second bias current by adding the first bias current with a current flowing through the differential input pair stage; applying the second bias current to the cascode stage; and generating an RF output signal with the cascode stage based on the RF input signal.

Implementations may include one or more of the following features. The method where the RF input signal includes a frequency higher than 10 GHz. The method where the first bias current includes 0.5 mA, and the second bias current includes 3 mA. The method where the first bias current is substantially unaffected by the RF input signal.

Yet another general aspect includes an RF amplifier including: a first bipolar transistor including base coupled to a first differential input node and to a first reference voltage node, and an emitter coupled to a first supply terminal through a first resistor; a second bipolar transistor including base coupled to a second differential input node and to the first reference voltage node, and an emitter coupled to a first supply terminal through the first resistor; a third bipolar transistor including an emitter coupled to a collector of the first bipolar transistor, and a collector coupled to a second supply terminal; a fourth bipolar transistor including an emitter coupled to a collector of the second bipolar transistor, and a collector coupled to the second supply terminal; a fifth bipolar transistor including a collector coupled to the collector of the third bipolar transistor, and a base coupled to the first reference voltage node; and a sixth bipolar transistor including a collector coupled to the collector of the fourth bipolar transistor, and a base coupled to the first reference voltage node.

Implementations may include one or more of the following features. The RF amplifier where each of the first, second, third, fourth, fifth, and sixth bipolar transistors include an n-type SiGe bipolar transistor. The RF amplifier where a first transmission line element is coupled between a collector of the first bipolar transistor and the emitter of the third bipolar transistor; and a second transmission line element is coupled between a collector of the second bipolar transistor and the emitter of the fourth bipolar transistor. The RF amplifier where an emitter of the fifth bipolar transistor is coupled to an emitter of the sixth bipolar transistors through a first transmission line element. The RF amplifier where the emitter of the fifth bipolar transistor is coupled the first supply terminal through a second resistor. The RF amplifier where an emitter of the fifth bipolar transistor is coupled the first supply terminal through a second resistor in series with a first transmission line element; and an emitter of the sixth bipolar transistor is coupled the first supply terminal through a third resistor in series with a second transmission line element.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a differential input pair stage comprising bipolar transistors and configured to receive an RF input signal;
   a cascode stage coupled between the differential input pair stage and an output node, the cascode stage comprising bipolar transistors; and
   a current source comprising a first bipolar transistor coupled to a first output of the differential input pair stage and a second bipolar transistor coupled to a second output of the differential input pair stage, wherein the differential input pair stage is coupled to a first reference voltage node and is further coupled to a first resistor coupled to a ground terminal, and the current source is coupled to the first reference voltage node and is further coupled to a second resistor coupled to the ground terminal.

2. The circuit of claim 1, further comprising a reference voltage generator coupled to the first reference voltage node.

3. The circuit of claim 2, wherein the cascode stage is further coupled to a second reference voltage node.

4. The circuit of claim 3, wherein the reference voltage generator is further coupled to the second reference voltage node.

5. The circuit of claim 1, wherein the first bipolar transistor of the current source and the second bipolar transistor of the current source form a differential pair.

6. The circuit of claim 5, wherein emitters of the differential pair of the current source are coupled to each other through a transmission line element.

7. The circuit of claim 5, wherein the first bipolar transistor of the current source comprises an emitter coupled to ground through a first transmission line element coupled in series with the second resistor, and the second bipolar transistor of the current source comprises an emitter coupled to ground through a second transmission line element coupled in series with a third resistor.

8. The circuit of claim 1, wherein the first resistor has a resistance between 5Ω, and 30Ω, and the second resistor has a resistance between 50Ω, and 100Ω.

9. The circuit of claim 1, wherein emitters of the differential input pair stage are coupled to each other through a transmission line element.

10. The circuit of claim 1, wherein the RF input signal has a frequency between 10 GHz and 100 GHz.

11. The circuit of claim 1, wherein a supply terminal coupled to the cascode stage is configured to receive a supply voltage lower than three times a forward biased base-emitter voltage of the bipolar transistors of the differential input pair stage.

12. The circuit of claim 11, wherein the supply voltage comprises a voltage lower than 2 V.

13. The circuit of claim 1, further comprising:
   a first balun circuit coupled to an output of the cascode stage, the first balun circuit having a first transformer; and
   a second balun circuit coupled to an input of the differential input pair stage, the second balun circuit having a second transformer.

14. The circuit of claim 1, wherein an inductive voltage divider is coupled to an output of the cascode stage.

15. A method of operating an RF amplifier comprising a differential input pair stage comprising bipolar transistors, the differential input pair stage coupled to a first resistor coupled to ground, a cascode stage comprising bipolar transistors and having an input coupled to an output of the differential input pair stage, and a current source comprising bipolar transistors having an output coupled to the output of the differential input pair stage, the current source coupled to a second resistor coupled to ground, the current source further coupled to a reference voltage node, the method comprising:
   receiving an RF input signal with the differential input pair stage, wherein the differential input pair stage is coupled to the reference voltage node;
   providing a reference voltage to the reference voltage node;
   generating a first bias current with the current source by biasing the current source with the reference voltage;
   generating a second bias current by adding the first bias current with a current flowing through the differential input pair stage;
   applying the second bias current to the cascode stage; and
   generating an RF output signal with the cascode stage based on the RF input signal.

16. The method of claim 15, wherein the RF input signal comprises a frequency higher than 10 GHz.

17. The method of claim 15, wherein the first bias current comprises 0.5 mA, and the second bias current comprises 3 mA.

18. The method of claim 15, wherein the first bias current is substantially unaffected by the RF input signal.

19. An RF amplifier comprising:
   a first bipolar transistor comprising
      a base coupled to a first differential input node and to a first reference voltage node, and
      an emitter coupled to a first supply terminal through a first resistor;
   a second bipolar transistor comprising
      a base coupled to a second differential input node and to the first reference voltage node, and
      an emitter coupled to the first supply terminal through the first resistor;
   a third bipolar transistor comprising
      an emitter coupled to a collector of the first bipolar transistor, and
      a collector coupled to a second supply terminal;

a fourth bipolar transistor comprising
  an emitter coupled to a collector of the second bipolar transistor, and
  a collector coupled to the second supply terminal;
a fifth bipolar transistor comprising
  a collector coupled to the collector of the third bipolar transistor, and
  a base coupled to the first reference voltage node; and
a sixth bipolar transistor comprising
  a collector coupled to the collector of the fourth bipolar transistor, and
  a base coupled to the first reference voltage node.

20. The RF amplifier of claim 19, wherein each of the first, second, third, fourth, fifth, and sixth bipolar transistors comprise an n-type SiGe bipolar transistor.

21. The RF amplifier of claim 19, wherein
a first transmission line element is coupled between a collector of the first bipolar transistor and the emitter of the third bipolar transistor; and
a second transmission line element is coupled between a collector of the second bipolar transistor and the emitter of the fourth bipolar transistor.

22. The RF amplifier of claim 19, wherein an emitter of the fifth bipolar transistor is coupled to an emitter of the sixth bipolar transistor through a first transmission line element.

23. The RF amplifier of claim 22, wherein the emitter of the fifth bipolar transistor is coupled the first supply terminal through a second resistor.

24. The RF amplifier of claim 19, wherein
an emitter of the fifth bipolar transistor is coupled the first supply terminal through a second resistor in series with a first transmission line element; and
an emitter of the sixth bipolar transistor is coupled the first supply terminal through a third resistor in series with a second transmission line element.

25. The method of claim 15, further comprising providing a second reference voltage to a second reference voltage node coupled to the cascode stage.

* * * * *